United States Patent [19]

Rempfer et al.

[11] Patent Number: 5,070,259
[45] Date of Patent: Dec. 3, 1991

[54] CONSTANT CURRENT, HIGHSPEED, AUTO-ZEROED, CMOS COMPARATOR

[75] Inventors: William C. Rempfer, Santa Clara; Robert C. Dobkin, Monte Sereno, both of Calif.

[73] Assignee: Linear Technology Corporation, Milpitas, Calif.

[21] Appl. No.: 456,354

[22] Filed: Dec. 26, 1989

[51] Int. Cl.$^5$ .................... H03K 5/24; H03K 17/14
[52] U.S. Cl. .................... 307/350; 307/355; 307/491; 307/585
[58] Field of Search ............ 307/350, 576, 579, 355, 307/356, 362, 451, 469, 443, 491, 585

[56] References Cited

U.S. PATENT DOCUMENTS 4,074,150  2/1978  Buckley, III et al. ............ 307/362
4,779,013  10/1988  Tanaka ............................ 307/443

Primary Examiner—John Zazworsky
Attorney, Agent, or Firm—Flehr, Hohbach, Test, Albritton & Herbert

[57] ABSTRACT

A constant current amplifier stage for a voltage comparator circuit includes a first CMOS transistor pair having a common gate terminal and a common drain terminal and a second CMOS transistor pair which functions as a load for the first CMOS transistor pair. The second CMOS transistor pair has a common gate terminal and a common drain terminal both of which are connected to the common drain terminal of the first CMOS transistor pair. The transistors are configured so that the current through the first transistor pair at null is at least twice the current through the second transistor pair at null voltage.

7 Claims, 2 Drawing Sheets

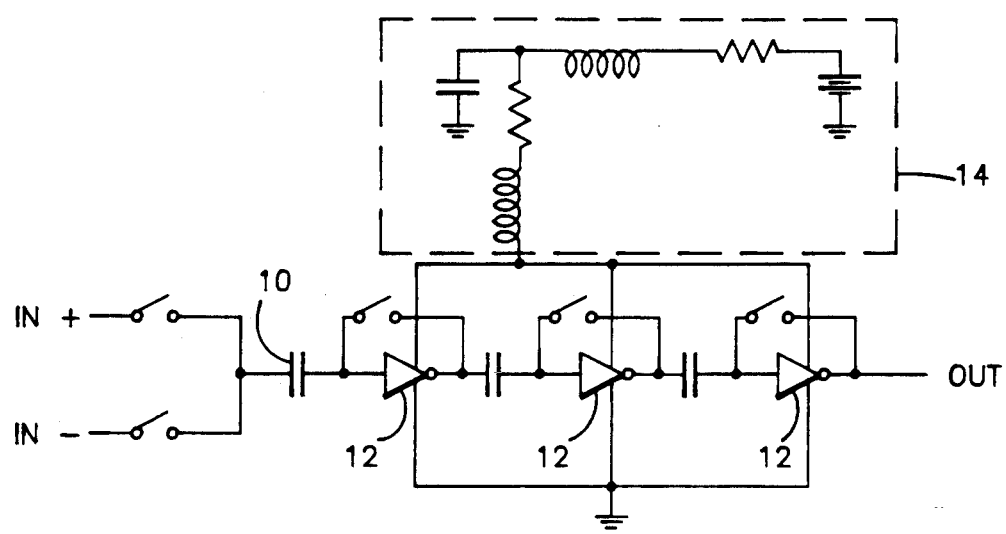
(PRIOR ART)
FIG.—1
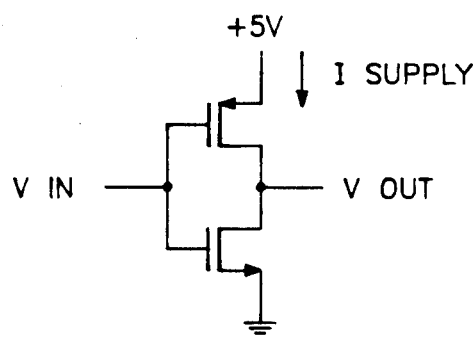
FIG.—2
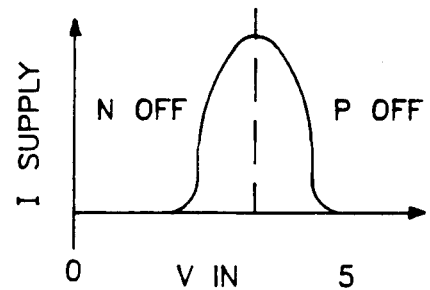
FIG.—3A
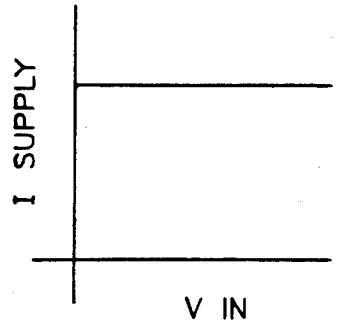
FIG.—3B
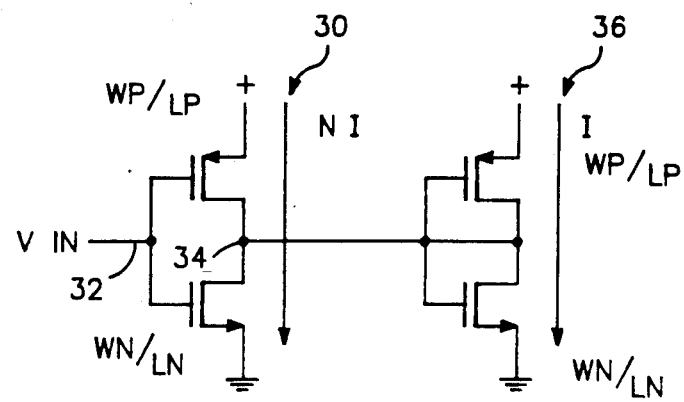
FIG.—4

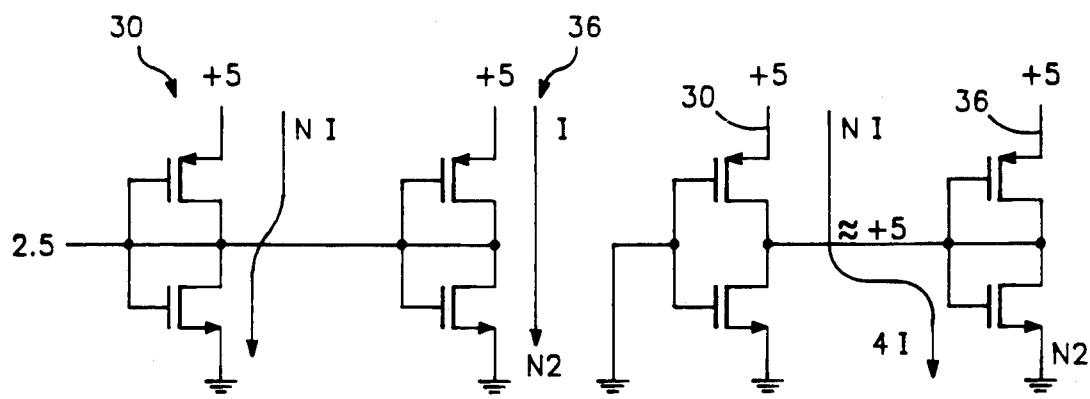
FIG.—5A    FIG.—5B
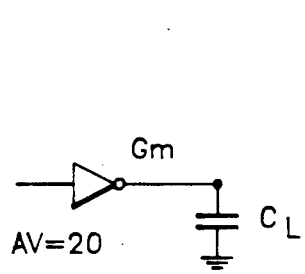
FIG.—6A
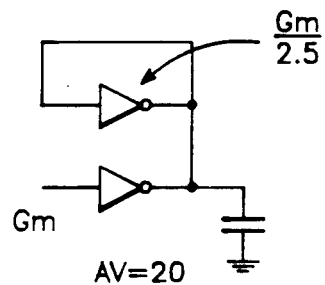
FIG.—6B
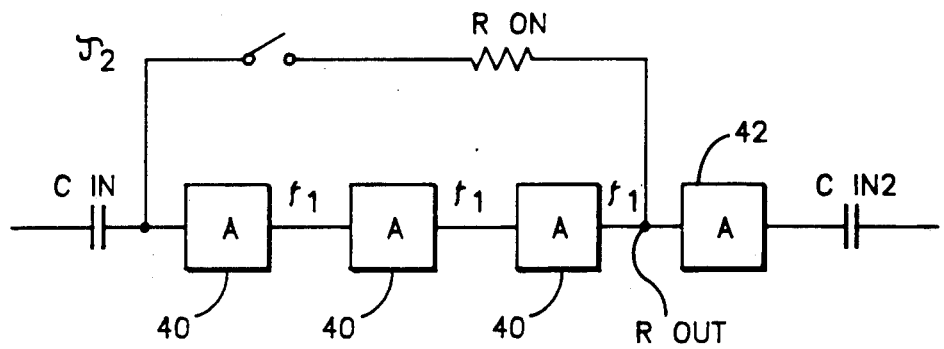
FIG.—7

CONSTANT CURRENT, HIGHSPEED, AUTO-ZEROED, CMOS COMPARATOR

BACKGROUND OF THE INVENTION

This invention relates generally to comparator circuits, and more particularly the invention relates to a comparator circuit which draws constant supply current and thus reduces sensitivity to non-zero power supply impedances.

Conventional switched capacitor comparator circuits such as that used in the LTC 1040, LTC 1090, and LTC 1290 manufactured by Linear Technology Corporation (Assignee herein) use a single CMOS inverter as the basic gain element. The well known "totem pole" characteristic of the inverter supply current causes the comparator to draw high current when the CMOS inverter is near its null point and low current when the CMOS inverter is away from its null point. The poor power supply rejection ratio (PSRR) of the inverter makes the comparator very sensitive to power supply variations created by the variation in supply current drawn by the comparator or a neighboring comparator on the same chip. This sensitivity to self-created power supply perturbations creates the need for expensive, large value, high quality decoupling capacitors and can result in more difficult supply decoupling and wiring in the use of the chip.

Heretofore, solutions to the problem focused on reducing the sensitivity of the comparator to supply variations, for example by using differential amplification. However, these approaches adversely affect simplicity of the circuit, easy single supply implementation, ease of auto zeroing, and compatibility with existing system architectures.

SUMMARY OF THE INVENTION

An object of the present invention is an improved high speed, auto zeroed comparator.

Another object of the invention is a voltage comparator circuit having increased bandwidth.

A feature of the invention is a comparator circuit in which amplifier elements draw substantially constant supply currents.

Briefly, in accordance with the invention, a gain element for use in a voltage comparator circuit comprises a first CMOS transistor pair having a common gate input terminal and a common drain output terminal. A second CMOS transistor pair is connected to the common drain output terminal of the CMOS transistor pair as a load. The second CMOS transistor pair has a common gate terminal and a common drain terminal, and means is provided for interconnecting the output terminal of the first CMOS transistor pair and the common gate terminal and the common drain terminal of the second CMOS transistor pair.

The first CMOS transistor pair and the second CMOS transistor pair are connectable between the same power terminals, the first CMOS transistor pair being configured to draw at least twice the current drawn by the second CMOS transistor pair for the same voltage bias. In a preferred embodiment the first CMOS transistor pair draws 2.5 times the current drawn by the second CMOS transistor pair.

The gain element in accordance with the invention has reduced gain as compared with a single CMOS transistor pair gain element. However, this can be offset by cascading a plurality of gain elements with which an auto-zeroing circuit can be used between the input of the cascaded gain elements and the output of the cascaded gain elements, just as with the single CMOS transistor pair gain element.

The invention and objects and features thereof will be more readily apparent from the following detailed description and appended claims when taken with the drawing, in which:

BRIEF DESCRIPTION OF THE DRAWING

FIG. 1 is a schematic diagram of a conventional auto-zeroed CMOS comparator circuit.

FIG. 2 is a schematic of one amplifier element in the comparator of FIG. 1.

FIG. 3A and FIG. 3B are plots of supply current for the amplifier element of FIG. 2 and for a constant supply circuit for an amplifier element in accordance with the present invention.

FIG. 4 is a schematic of an amplifier element in accordance with one embodiment of the present invention.

FIG. 5A and FIG. 5B are schematics illustrating current through the amplifier element of FIG. 4 at null and in the rail.

FIG. 6A and 6B illustrate functional schematics of a prior art amplifier and an amplifier in accordance with the invention.

FIG. 7 is a schematic of a voltage comparator circuit having a plurality of cascaded amplifier elements in accordance with another embodiment of the invention.

DETAILED DESCRIPTION OF ILLUSTRATIVE EMBODIMENTS

Referring now to the drawings, FIG. 1 is a schematic of a conventional auto-zeroed CMOS comparator such as that used in the Linear Technology LTC 1040 dual micropower comparator, and the LTC 1090 and the LTC 1290 data acquisition systems. For example, in the operation of the LTC 1040, two inputs, IN+ and IN−, are alternately applied through a coupling capacitor 10 to the input of the first plurality of amplifiers 12. Each amplifier 12 can be periodically nulled by means of a feedback loop from the output of the amplifier to the input of the amplifier. Each of the amplifiers is connected to a power source 14 which is shown schematically by its equivalent circuit.

Each amplifier 12 of the circuit of FIG. 1 comprises a single CMOS transistor pair as shown schematically in FIG. 2. As noted above, due to the "totem pole" characteristic of the inverter, supply current through the amplifier of FIG. 2 is a high current when near its null point and a low current when away from its null point. This is illustrated schematically in FIG. 3A. At the null point both the N and P transistors of the CMOS transistor pair in FIG. 2 are on and the supply current is near maximum. For lower values of the VIN the N channel transistor becomes less conductive, and for greater values of the VIN' the P transistor becomes less conductive. These large fluctuations in supply current with input signal, coupled with the poor power supply rejection ratio (PSRR) of the inverter, makes the comparator very sensitive to power supply impedance.

FIG. 4 is a schematic of an amplifier stage in accordance with the present invention which draws substantially continuous supply current for different values of input voltage as illustrated in FIG. 3B. The amplifier stage includes a first CMOS transistor pair 30 having a common gate terminal 32 and a common drain terminal 34. A second CMOS transistor pair 36 is connected to the common drain terminal 34 as a load device for the first CMOS transistor pair 30. The transistor pair 36 has a common gate terminal and a common drain terminal, both of which are connected to the common drain terminal 34 of the CMOS transistor 30.

The two CMOS transistor pairs are configured so that the width to length ratio, W/L of the two transistors in the pair 30 is N times larger than the width to length ratio of the two transistors of the pair 36. Consequently, the supply current through the first transistor pair 30 at null is N times the current through the second transistor pair 36 at null. The choice of N will determine the variation of supply current for various levels of input voltage VIN.

FIG. 5A is a schematic of the amplifier stage of FIG. 4 at null at which the total supply current, $I_s$ is (N+1) I where I is the current through the second transistor pair 36.

FIG. 5B is a schematic of the transistor pairs of FIG. 4 showing the current path for the conduction of transistor pair 30 in the rail, i.e. at either extreme of the input voltage ($V_{in}$=0 v or 5 v). In this operating mode the supply current, $I_s \approx 4I$ because the N channel transistor of the CMOS pair 36 has a square law characteristic and has roughly twice the overdrive as at null. By setting I (null) = I (rail)

$$(N+1) \times I = 4I$$
therefore $$N=3.$$

In reality, in the rail $I_s$ is approximately 3.5 I because the N channel transistor does not have quite twice the overdrive. This results in N=2.5 being an optimum election.

A further benefit of the amplifier configuration of FIG. 4 is increased bandwidth. This is illustrated in the schematics of FIG. 6A and FIG. 6B for the conventional circuit and for the circuit in accordance with the invention, respectively. Referring to FIG. 6A, the RC time constant $\tau = R$ out $\times C_L$, where $$R \text{ out} = Av(1/Gm) = 20(1/Gm), \text{ and}$$

$$\tau = 20(C_L/Gm),$$

and where a typical inverter gain of 20 is used as an example.

In the new circuitry $$\tau = R \text{ out} \times C_L, \text{ and}$$

$$R \text{ out} = Av(1/Gm) = 2.5(1/Gm), \text{ and}$$

$$\tau = 2.5(C_L/Gm).$$

Therefore, it is noted that $\tau$ is reduced by a factor of 8, and the frequency for the 3db point is increased by a factor of 8.

The amplifier stage illustrated schematically in FIG. 4 has reduced gain. In order to get enough gain (10 to 20) a plurality of stages can be cascaded as shown in FIG. 7 where each block A represents the circuitry of FIG. 4. The input is coupled through an input capacitor CIN and the output is coupled through a capacitor CIN2. The output capacitor is buffered from the cascaded amplifiers by a fourth amplifier 42. A feedback path with resistance Ron periodically shorts the cascaded amplifiers 40, and in order to frequency stabilize the loop, the feedback time constant, $\tau_2$, is set so that it is at least twice the gain times the output poles, $\tau_1$. For a gain of A=2.5, the three stage gain Av is $A^3$ or $\approx 15$.

$$\tau 2 \geq 2 \, Av\tau 1 \geq 30\tau 1.$$

Because $\tau 1 = R$ out $\cdot$ Cs and $$\tau 2 = (R \text{ out} + R \text{ on}) \text{ Cin, then}$$

$\tau 2 > 30 \tau 1$ if Cin is greater than 30 times $C_s$ which in most practical situations does not provide a limiting constraint.

There has been described a new voltage comparator circuit and amplifier stage for use therein which draws a substantially constant supply current over its input voltage range, and therefore provides greater immunity to power supply impedance. Since the output impedance is reduced by loading there is a significant speed advantage, and a further advantage of the circuit is increased bandwidth and reduced comparison delay.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

We claim:

1. A voltage comparator circuit including a gain element including a first CMOS transistor pair having a common gate input terminal and a common drain output terminal, a load connected to said common drain output terminal of said first CMOS transistor pair, said load comprising a second CMOS transistor pair having a common gate terminal and a common drain terminal connected to one another, wherein said first CMOS transistor pair and said second CMOS transistor pair are connectable between the same power supply terminals, said first CMOS transistor pair being configured to draw at least twice the current drawn by said second CMOS transistor pair for a null voltage input, and means interconnecting said output terminal of said first CMOS transistor pair and said common gate terminal and said common drain terminal of said second CMOS transistor pair.

2. A voltage comparator circuit as defined by claim 1 wherein said first CMOS transistor pair draws approximately 2.5 times the current drawn by said second CMOS transistor pair for a null voltage input.

3. A voltage comparator circuit comprising
at least one input terminal for receiving voltages to be compared,
at least one auto-zeroed amplifier stage, said amplifier stage including a first CMOS transistor pair having a common gate terminal and a common drain terminal, a second CMOS transistor pair having a common gate terminal and a common drain terminal, and first means interconnecting said common drain terminal of said first CMOS transistor pair and said common gate terminal and said common drain terminal of said second CMOS transistor pair, said at least one auto-zeroed amplifier stage including feedback means for selectively zeroing said at least one amplifier stage, an output terminal, second means capacitively coupling at least one input terminal to said common gate terminal of said first CMOS transistor pair, and third means coupling said common drain terminal of said second CMOS transistor pair to said output terminal.

4. The voltage comparator circuit as defined by claim 3 wherein said at least one auto-zeroed amplifier stage includes a plurality of serially connected amplifier stages, said feedback means selectively connecting an output of the last amplifier stage to an input of the first amplifier stage.

5. The voltage comparator circuit as defined by claim 3 wherein said third means includes an amplifier stage.

6. The voltage comparator circuit as defined by claim 3 wherein said first CMOS transistor pair is configured to draw at least twice the current drawn by said second CMOS transistor pair for the same null voltage.

7. The voltage comparator circuit as defined by claim 6 wherein said first CMOS transistor pair draws approximately 2.5 times the current drawn by said second CMOS transistor pair.

* * * * *